(12) United States Patent
Janssen et al.

(10) Patent No.: US 7,199,861 B2
(45) Date of Patent: Apr. 3, 2007

(54) LITHOGRAPHIC APPARATUS AND DEVICE MANUFACTURING METHOD

(75) Inventors: Maurice Henricus Franciscus Janssen, Eindhoven (NL); Rene Hubert Jacobus Carpaij, Vught (NL); Jan Bernard Plechelmus Van Schoot, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 178 days.

(21) Appl. No.: 10/857,351

(22) Filed: Jun. 1, 2004

(65) Prior Publication Data

US 2005/0264790 A1    Dec. 1, 2005

(51) Int. Cl.
*G03B 27/42* (2006.01)

(52) U.S. Cl. .............................. 355/53; 355/69; 355/77
(58) Field of Classification Search .................... None
See application file for complete search history.

(56) References Cited

U.S. PATENT DOCUMENTS

| 6,493,063 | B1 * | 12/2002 | Seltmann et al. ............. 355/53 |
| 6,869,739 | B1 * | 3/2005 | Ausschnitt et al. ........... 430/30 |
| 6,884,984 | B2 * | 4/2005 | Ye et al. .................. 250/208.1 |
| 2003/0203291 | A1 * | 10/2003 | Misaka .......................... 430/5 |
| 2004/0165164 | A1 * | 8/2004 | Raebiger et al. .............. 355/53 |

* cited by examiner

*Primary Examiner*—D. Rutledge
(74) *Attorney, Agent, or Firm*—Pillsbury Winthrop Shaw Pittman, LLP

(57) ABSTRACT

A lithographic apparatus comprises an illumination system for providing a projection beam of radiation and a support structure for supporting a patterning device which impart the projection beam with a pattern in its cross-section. The patterning device has a non-flat critical dimension (CD) profile across its width. A projection system projects the patterned beam onto a target portion of a substrate. Dose variation device for varying the radiation dose across the width of the target portion compensates for the non-flat CD profile of the patterning device.

32 Claims, 2 Drawing Sheets

LITHOGRAPHIC APPARATUS AND DEVICE MANUFACTURING METHOD

FIELD OF THE INVENTION

The present invention relates generally to lithographic apparatus and device manufacturing methods.

BACKGROUND TO THE INVENTION

A lithographic apparatus is a machine that applies a desired pattern onto a target portion of a substrate. Lithographic apparatus can be used, for example, in the manufacture of integrated circuits (ICs). In that circumstance, a patterning means, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

Between the mask and the substrate is disposed a projection system for imaging the irradiated portion of the mask into the target portion of the substrate. The projection system includes components for directing, shaping or controlling the projection beam of irradiation, and these components typically include refractive optics, reflective optics, and/or catadioptric systems, for example.

An important feature in lithography is the size of features of the pattern applied to the substrate. It is desirable to produce apparatus capable of resolving features as small and close together as possible. Furthermore, it is desirable for the maximum resolution available to be uniform across the width of the target portion. The size of the smallest resolvable feature is called the critical dimension (CD). A number of parameters affect the CD at the substrate, and one of the most important of these is the size of features on the mask. The size of feature on the mask leading to the smallest resolvable feature at the substrate gives rise to a critical dimension of the mask. It will be appreciated that, due to the magnification of the projection system, the value of the critical dimension of the mask and the critical dimension (CD) of the substrate may not be the same.

The pattern on a mask is typically produced in a similar manner to that on a wafer. A mask blank comprises a mask substrate (formed from synthetic quartz, for example) coated with a chrome film. A layer of resist is deposited on the chrome film, normally using a spin-on process. The resist is illuminated by a patterned radiation beam, causing chemical changes in the resist in the form of the pattern exposed by the radiation. The mask blank is then developed to fix the pattern in the resist, and then etched so that the pattern is etched into the chrome. The resist is then removed.

The process of depositing resist onto the chrome film has a natural tendency to result in a layer of resist which has a different thickness at the edges of the mask blank than at the center. Some processes result in the resist being thicker at the edges, and some thinner. This has the effect that the critical dimension at the center of the mask blank is different to that at the edge. There is therefore not a uniform critical dimension profile across the width of the mask, and this will lead to a non-uniform CD profile on the substrate.

The ideal solution to this problem would be to modify the deposition of resist so as to produce a substantially flat profile across the full width of the mask. This can be done by adopting a "trial and error" process in setting up the deposition process, which is most accurate when the deposition conditions are substantially identical. Unfortunately it has so far proved impossible to deposit resist with a perfectly flat profile, and in practice resist deposited using such methods, even though almost flat, exhibits a variation in thickness across the mask. Furthermore, this variation in thickness may manifest itself as a "W" shape in the thickness profile, or even as an oscillating thickness. In addition, the thickness profile tends to vary between masks.

SUMMARY

According to an aspect of the invention, there is provided a lithographic apparatus including, an illumination system for providing a projection beam of radiation, a support structure for supporting a patterning device, the patterning device serving to impart the projection beam with a pattern in its cross-section, a substrate table for holding a substrate, and a projection system for projecting the patterned beam onto a target portion of the substrate, wherein the patterning device has a critical dimension whose value varies with position across the patterning device, the apparatus further comprising dose adjusting mechanisms for varying the radiation dose applied to the target portion according to the position on the target portion so as to compensate for the variation of critical dimension across the patterning device.

Thus there is no need to attempt to deposit resist onto the mask having a uniform critical dimension at all positions on the mask. If the critical dimension profile of the mask is stable and characterisable, it is possible to correct for this profile when exposing the target portion of the substrate. This enables the formation of a target portion having a substantially constant critical dimension (CD) at all positions of the target portion.

The dose variation mechanisms may vary the intensity of radiation across the target portion. Alternatively or in addition, the time for which portions of the target portion are exposed to the patterned beam may be varied.

In one embodiment, the patterning device has associated with it a set including a plurality of positions on the patterning device and a plurality of critical dimension values, each critical dimension value corresponding to one of the positions on the patterning device. The target portion may have associated with it a plurality of positions, each corresponding to a position on the patterning device and associated critical dimension value. The dose variation mechanism may provide a defined radiation dose to each of the positions on the target portion to compensate for the associated critical dimension value on the patterning device. Thus it is not necessary for the radiation dose to change continuously across the target portion; it can be achieved in a plurality of discrete steps.

The variation in critical dimension across the patterning device may be known before the patterned beam is applied to a target portion. Alternatively, the variation in critical dimension across the patterning device may be measured, for example by exposing a test target portion.

The critical dimension of the patterning device may be higher, or lower, at the edge than in the middle.

According to a further aspect of the invention, there is provided a device manufacturing method including providing a substrate, providing a projection beam of radiation using an illumination system, using a patterning device to impart the projection beam with a pattern in its cross-section, and projecting the patterned beam of radiation onto a target portion of the substrate, wherein the patterning device has a critical dimension whose value varies with position across the patterning device, the method further including varying the radiation dose applied to the target portion so as to compensate for the variation of critical dimension across the patterning device.

According to a yet further aspect of the invention there is provided a method of forming a patterning device for imparting a projection beam with a pattern in its cross section in a lithographic apparatus, the method including providing a mask substrate having a chrome film formed thereon, depositing a layer of resist on the chrome film, the thickness of the layer of resist being different at the edge of the film to the center, illuminating the resist with a patterned beam of radiation to impose a pattern thereon, developing the resist to fix the pattern, etching the chrome layer in the form of the pattern, whereby the critical dimension of the pattern etched in the chrome layer is different at the edge of the patterning device from that at the center.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Figure 1:
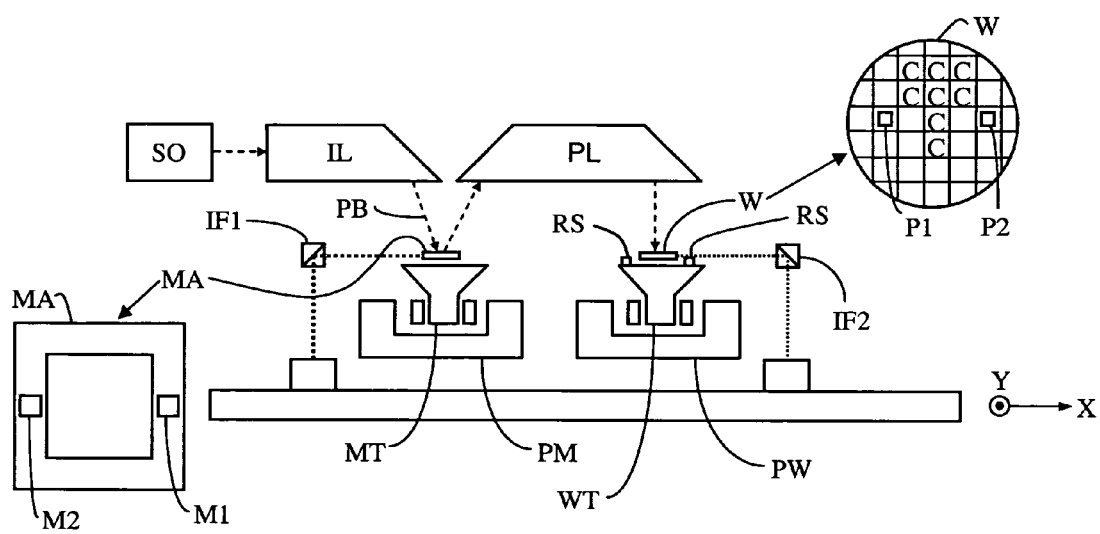
FIG. 1 depicts a lithographic apparatus according to an embodiment of the invention.

While the invention is susceptible to various modifications and alternative forms, specific embodiments thereof have been shown by way of example in the drawings and will herein be described in detail. It should be understood, however, that this specification is not intended to limit the invention to the particular forms disclosed herein, but on the contrary, the intention is to cover all modifications, equivalents, and alternatives falling within the scope of the invention, as defined by the appended claims.

DETAILED DESCRIPTION OF EMBODIMENTS

FIG. 1 schematically depicts a lithographic apparatus. The apparatus comprises:

an illumination system (illuminator) IL for providing a projection beam PB of radiation (e.g. UV or EUV radiation).

a first support structure (e.g. a mask table) MT for supporting a patterning device (e.g. a mask) MA and connected to first positioner PM for accurately positioning the patterning device with respect to item PL;

a substrate table (e.g. a wafer table) WT for holding a substrate (e.g. a resist-coated wafer) W and connected to second positioner PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjustable optical elements for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioner PW and position sensor IF2 (e.g. an interferometric device), the substrate table WT can be moved accurately, e.g. so as to position different target portions C in the path of the beam PB. Similarly, the first positioner PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
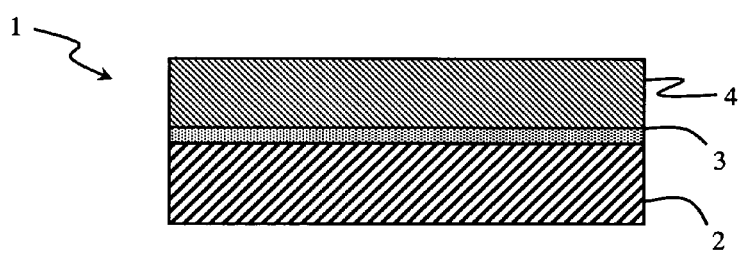
FIG. 2 depicts a mask blank for forming a mask usable in the apparatus of FIG. 1.

FIG. 2 is a schematic depiction of a mask blank 1, used to form a mask MA such as that shown in FIG. 1. The mask blank 1 comprises a mask substrate 2 having a chrome film 3 formed thereon. The mask substrate is formed from synthetic quartz. The chrome film is approximately 80 nm thick, and includes chrome and chrome oxide layers. A layer of radiation-sensitive material (resist) 4 is deposited on the chrome film 3. This deposition is usually performed using spin-on techniques, although Chemical Vapour Deposition (CVD) techniques may also be used. CVD techniques are generally slower than spin-on techniques and thus less suitable for high throughput production. The mask blank is then baked in an oven.

Figure 3:
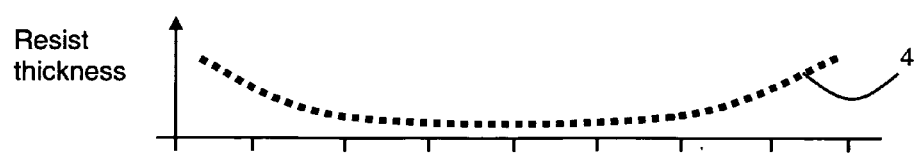
FIG. 3 is a schematic illustration of the thickness profile of resist in the mask blank of FIG. 2.

FIG. 3 is a schematic illustration of the thickness of the resist 4 across the width of the mask blank 1. The resist 4 is thicker at the edges of the blank 1 than in the center, as a result of the deposition process.

The first step in forming a pattern on the mask is to expose the resist 4 to a patterned beam of radiation. The radiation causes a chemical change in the resist in the shape of the pattern. This chemical change is "fixed" in the resist by developing the resist. This may involve baking the mask again, followed by a "wet" process which involves submerging the exposed material in a liquid developing agent.

Figure 4:
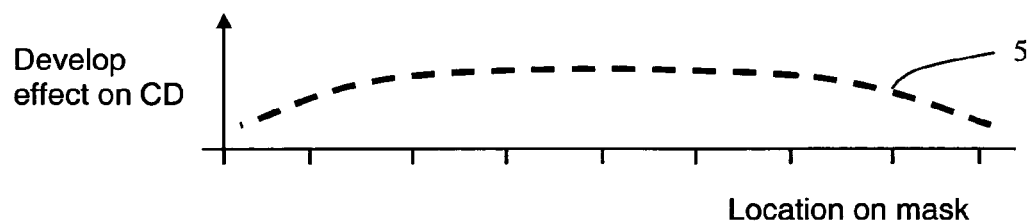
FIG. 4 is a schematic illustration of the critical dimension profile of the mask blank shown in FIG. 2 following developing of the resist.

The variation in thickness of the resist 4 across the width of the mask causes a variation in the critical dimension—i.e. the minimum feature size—across the width of the mask. FIG. 4 shows schematically the critical dimension profile 5 of the resist 4 across the width of the mask 1 once the resist has been developed. It will be appreciated that the curve shown in FIG. 4 is illustrative and not to scale. Furthermore, the direction of the curve of the critical dimension profile 5 depends on the type of resist used (i.e. positive or negative resist) and the type of structure etched into the chrome (i.e. lines or trenches). For some situations a thicker resist at the edge of the mask will lead to a larger critical dimension at that point, and in other situations a thicker resist at the edge will lead to a smaller critical dimension. However, in all cases the critical dimension is dependent on the resist thickness.

Figure 5:
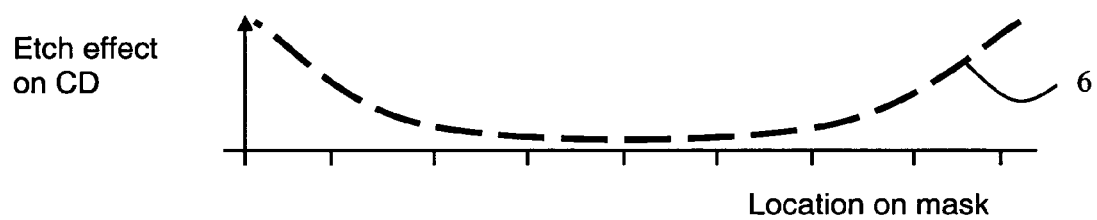
FIG. 5 is a schematic illustration of the critical dimension profile of the mask of FIG. 2 following etching of the chrome layer.

After the bake and develop steps, the chrome film 3 is etched to reveal the pattern. The developed resist determines which parts of the chrome 3 are etched. FIG. 5 illustrates schematically the critical dimension profile 6 of the mask 1 following etching of the chrome film 3. Again, it will be appreciated that FIG. 5 is an illustrative diagram only and the critical dimension profile shown therein may be different. This is the final CD profile of the mask.

Although the critical dimension profile 6 of the mask 1 is not flat, it can be produced by a stable process that will repeatably and reliably result in a known curved profile. If the manufacturing process is sufficiently tightly controlled, it is possible to ensure that the critical dimension profile of subsequent masks will be the same to within a known tolerance. The critical dimension profile 6 of the mask can be calculated from the parameters used in the resist deposition or measured, either directly on the mask or by using the mask 1 to expose a sample target portion in a lithographic apparatus such as that shown in FIG. 1, from which the CD profile can be obtained.

Once the critical dimension profile of the mask MA is known, it is possible to modify the radiation dose across the width of the target portion C to compensate for this when the mask is used in a lithographic apparatus. The variation 7 in radiation dose across the width of the mask is shown schematically in FIG. 6. This variation ensures that the portions at the edges of the mask, where the critical dimension is high, receive less radiation than the center of the mask, where the critical dimension is low. The CD at the target portion is roughly proportional to the radiation dose used, so the low radiation dose (and therefore low CD) at the edge compensates for the high critical dimension of the features etched in the chrome. The dose may be varied by varying the intensity of the radiation, or the length of exposure, or both.

In order to simplify the process of varying the radiation dose across the target portion C to correct for the variation in the critical dimension of the mask MA, the surface of the mask MA may be divided into discrete portions, and the critical dimension of each portion measured (or otherwise determined). The target C is likewise divided up into portions, each corresponding to a portion of the mask MA. The dose applied to each portion of the target then corrects for the critical dimension of the corresponding portion of the mask MA.

Figure 6:
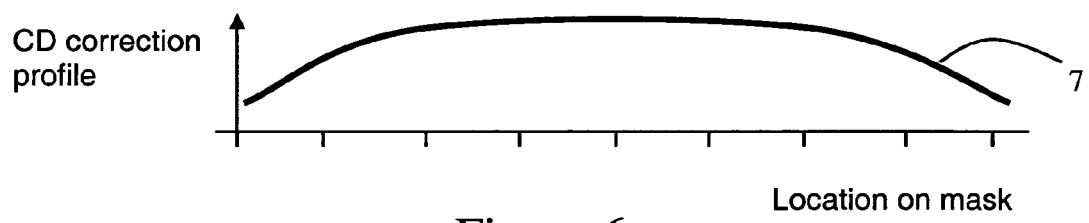
FIG. 6 is a schematic illustration of the radiation dose profile used to illuminate the mask in the lithographic apparatus of FIG. 1 so as to compensate for a non-flat critical dimension profile.
Figure 7:
FIG. 7 is a schematic illustration of the critical dimension (CD) profile of a target portion illuminated using a variable dose as shown in FIG. 6.

FIG. 7 illustrates the CD profile 8 of the target portion C following illumination by a variable dose as shown in FIG. 6. The dose variation 8 has compensated for the non-flat critical dimension profile 6 on the mask MA, leading to a flat CD profile 8 on the target portion.

While specific embodiments of the invention have been described above, it will be appreciated that the invention may be practiced otherwise than as described. The description is not intended to limit the invention. For example, in the example above the resist 4 is thicker at the edges of the mask blank 1 than in the center. However, any process which deposits resist in a stable fashion on the mask substrate 2 is suitable, and it may be that the resist is thinner at the edges than in the center. The dose variation profile 7 would need to be reversed to compensate for this.

The invention claimed is:

1. A lithographic apparatus comprising:
   an illumination system to condition a projection beam of radiation;
   a support structure to support a patterning device, the patterning device constructed to impart the projection beam with a pattern in its cross-section;
   a substrate table to hold a substrate; and
   a projection system to project the patterned beam onto a target portion of the substrate;
   wherein the patterning device has a critical dimension whose value varies with position across the patterning device,
   the apparatus further comprising a controller, configured and arranged to vary a radiation dose applied to the target portion according to a position on the target portion based on variation of the critical dimension of the patterning device so as to compensate for the variation of critical dimension.

2. The apparatus of claim 1, wherein the controller is configured to vary the intensity of radiation according to position across the target portion.

3. The apparatus of claim 1, wherein the controller is configured to vary the time for which portions of the target portion are exposed to the patterned beam.

4. The apparatus of claim 1, wherein the patterning device has associated with it a data set including information about a plurality of positions on the patterning device and a plurality of critical dimension values, each value corresponding to one of the positions on the patterning device.

5. The apparatus of claim 4, wherein the target portion has associated with it a data set including information about a plurality of positions on the target portion, each position on the target portion corresponding to a position on the patterning device and associated critical dimension value, and wherein the controller is configured to control the apparatus to provide a defined radiation dose to each of the positions on the target portion to compensate for the associated critical dimension value.

6. The apparatus of claim 1, wherein the variation of critical dimension across the patterning device is predetermined.

7. The apparatus of claim 1, further comprising a critical dimension measurement device constructed and arranged to measure the variation of critical dimension across the patterning device.

8. The apparatus of claim 1, wherein the critical dimension of the patterning device is higher at the edge than in the middle.

9. The apparatus of claim 1, wherein the critical dimension of the patterning device is lower at the edge than in the middle.

10. The apparatus of claim 1, wherein the critical dimension of the target portion is substantially constant at all positions on the target portion.

11. A device manufacturing method comprising:
providing a projection beam of radiation using an illumination system;
using a patterning device to impart the projection beam with a pattern in its cross-section, the patterning device having a critical dimension whose value varies with position across the patterning device;
projecting the patterned beam of radiation onto a target portion of a substrate; and
varying a radiation dose applied to the target portion according to the position on the target portion based on variation of the critical dimension of the patterning device so as to compensate for the variation of critical dimension.

12. The method of claim 11, wherein the radiation dose is varied by varying an intensity of radiation according to position across the target portion.

13. The method of claim 11, wherein the radiation dose is varied by varying a time for which portions of the target portion are exposed to the patterned beam.

14. The method of claim 11, further comprising generating a data set including a plurality of positions on the patterning device and a plurality of critical dimension values, each critical dimension value corresponding to one of the positions on the patterning device.

15. The method of claim 14, further comprising:
associating with the target portion the data set; and
providing a defined radiation dose to each of the positions on the target portion to compensate for the associated critical dimension value.

16. The method of claim 11, wherein the variation in critical dimension across the patterning device is predetermined.

17. The method of claim 11, further comprising measuring the variation of critical dimension across the patterning device.

18. The method of claim 11, wherein the critical dimension of the patterning device is higher at the edge of the patterning device than in the middle.

19. The method of claim 11, wherein the critical dimension of the patterning device is lower at the edge of the patterning device than in the middle.

20. The method of claim 11, wherein the critical dimension of the target portion is substantially constant with position across the target portion.

21. A method of forming a patterning device for imparting a projection beam with a pattern in its cross section in a lithographic apparatus, comprising:
providing a mask substrate having a radiation blocking film formed thereon;
depositing a layer of resist on the radiation blocking film, the thickness of the layer of resist being different at the edge of the film to the center;
illuminating the resist with a patterned beam of radiation to impose a pattern thereon;
developing the resist to fix the pattern;
etching the radiation blocking layer in the form of the pattern;
wherein the critical dimension of the pattern etched in the radiation blocking film is different at the edge of the patterning device from that at the center.

22. A method as in claim 21 wherein the radiation blocking film is a chrome film.

23. A method to correct for a varying critical dimension of a patterning device, the method comprising:
providing data regarding critical dimension values of the patterning device, a plurality of the values varying with position across the patterning device; and
calculating a radiation dose to be applied to the patterning device so as to compensate for the variation of critical dimension across the patterning device; the calculated radiation dose being based on the critical dimension values provided;
wherein the patterning device is exposed in accordance with the calculated radiation dose.

24. The method of claim 23, wherein the calculated radiation dose comprises an intensity of radiation varying according to position across a target portion of a substrate.

25. The method of claim 23, wherein the calculated radiation dose comprises a varying time for which portions of a target portion of the substrate are exposed to a beam imparted with a pattern by the patterning device.

26. The method of claim 23, further comprising generating a data set including a plurality of positions on the patterning device and a plurality of critical dimension values, each critical dimension value corresponding to one of the positions on the patterning device.

27. The method of claim 26, further comprising:
associating with a target portion of a substrate the data set; and
providing a defined radiation dose to each of the positions on the target portion to compensate for the associated critical dimension value.

28. The method of claim 23, wherein the variation in critical dimension across the patterning device is predetermined.

29. The method of claim 23, further comprising measuring the variation of critical dimension across the patterning device.

30. The method of claim 23, wherein the critical dimension of the patterning device is higher at the edge of the patterning device than in the middle.

31. The method of claim 23, wherein the critical dimension of the patterning device is lower at the edge of the patterning device than in the middle.

32. The method of claim 23, wherein the critical dimension of a target portion of a substrate exposed to a beam imparted with a pattern by the patterning device is substantially constant with position across the target portion.

* * * * *